United States Patent
Zhu et al.

(10) Patent No.: US 8,244,234 B2
(45) Date of Patent: Aug. 14, 2012

(54) SYSTEM AND METHOD OF MEASURING TOTAL RADIATED POWER FROM MOBILE WIRELESS COMMUNICATIONS DEVICE

(75) Inventors: Lizhong Zhu, Waterloo (CA); Michael Corrigan, Waterloo (CA); Perry Jarmuszewski, Waterloo (CA); Ying Tong Man, Waterloo (CA); George Mankaruse, Kitchener (CA); Yihong Qi, St. Agatha (CA)

(73) Assignee: Research In Motion Limited, Waterloo, Ontario (CA)

( * ) Notice: Subject to any disclaimer, the term of this patent is extended or adjusted under 35 U.S.C. 154(b) by 1001 days.

(21) Appl. No.: 11/831,983

(22) Filed: Aug. 1, 2007

(65) Prior Publication Data
US 2009/0033572 A1 Feb. 5, 2009

(51) Int. Cl.
*H04W 24/00* (2009.01)
(52) U.S. Cl. ............... 455/423; 455/67.11; 343/703
(58) Field of Classification Search .............. 455/423, 455/67.11; 343/703
See application file for complete search history.

(56) References Cited

U.S. PATENT DOCUMENTS

| | | | |
|---|---|---|---|
| 4,278,979 A | 7/1981 | Pelino | 343/703 |
| 5,440,227 A | 8/1995 | Rogers | 324/72.5 |
| 5,778,308 A | 7/1998 | Sroka et al. | 455/115 |
| 6,028,423 A | 2/2000 | Sanchez | 324/96 |
| 6,215,448 B1* | 4/2001 | DaSilva et al. | 343/703 |
| 6,965,837 B2 | 11/2005 | Vintola | 702/65 |
| 6,972,692 B2 | 12/2005 | Eaton et al. | 340/870.07 |
| 7,006,041 B2 | 2/2006 | Fujii et al. | 342/372 |
| 7,068,231 B2* | 6/2006 | Huang | 343/703 |
| 2004/0239334 A1* | 12/2004 | Kreager et al. | 324/538 |
| 2005/0049020 A1 | 3/2005 | Higgins et al. | 455/575.7 |
| 2006/0140145 A1* | 6/2006 | Ogawa | 370/328 |
| 2006/0240782 A1 | 10/2006 | Pollman et al. | 455/67.11 |
| 2007/0197180 A1* | 8/2007 | McKinzie et al. | 455/248.1 |
| 2007/0207754 A1* | 9/2007 | Gomi | 455/193.3 |
| 2008/0129610 A1* | 6/2008 | Tsfati et al. | 343/702 |
| 2011/0043328 A1* | 2/2011 | Bassali | 340/5.71 |

FOREIGN PATENT DOCUMENTS

| | | |
|---|---|---|
| WO | 2005/052608 | 9/2005 |
| WO | 2006/047677 | 4/2006 |

* cited by examiner

*Primary Examiner* — Justin Lee
(74) *Attorney, Agent, or Firm* — Allen, Dyer, Doppelt, Milbrath & Gilchrist, P.A.

(57) ABSTRACT

A system for testing a communications device includes a portable wireless communications device comprising a transmitter for transmitting an RF signal. A monitoring device receives the RF signals from the portable wireless communications device and analyzes the RF signals to determine total radiated power emitted from the transmitter. An adaptive antenna equivalent circuit is coupled to the transmitter. A connection line extends between the adaptive antenna equivalent circuit and the monitoring device. The adaptive antenna equivalent circuit has an equivalent antenna impedance matched to the portable wireless communications device and the connection line and monitoring device based on transmit frequency to ensure that total radiated power of the RF signals is transmitted from the transmitter to the monitoring device.

18 Claims, 7 Drawing Sheets

| | 850MHZ | | |
|---|---|---|---|
| FREQUENCY (MHZ) | 824.2 | 836.6 | 848.8 |
| PATH LOSS (1m CABLE +30dB ATTENUATOR) | 30.8db | 30.8db | 30.8db |
| MAGNITUDE | 0.54 | 0.548 | 0.553 |
| PHASE (DEG) | -88.5 | -105 | -122 |
| TRP MEASUREMENT | 29.9 | 30.2 | 29.6 |
| EQUIVALENT TRP MEASUREMENT (dBm) | 30.1 | 30.2 | 29.9 |
| | LOW | MID | HIGH |

| | 900MHZ | | |
|---|---|---|---|
| FREQUENCY (MHZ) | 880.2 | 897.6 | 914.8 |
| PATH LOSS (1m CABLE +30dB ATTENUATOR) | 30.8db | 30.8db | 30.8db |
| MAGNITUDE | 0.48 | 0.355 | 0.246 |
| PHASE (DEG) | -170 | 157 | 121 |
| TRP MEASUREMENT | 31.7 | 31.0 | 30.0 |
| EQUIVALENT TRP MEASUREMENT (dBm) | 30.9 | 31.0 | 30.8 |
| | LOW | MID | HIGH |

| | 1800MHZ | | |
|---|---|---|---|
| FREQUENCY (MHZ) | 1710.2 | 1747.4 | 1784.8 |
| PATH LOSS (1m CABLE +30dB ATTENUATOR) | 30.8db | 30.8db | 30.8db |
| MAGNITUDE | 0.44 | 0.219 | 0.077 |
| PHASE (DEG) | 120 | 87.3 | 17 |
| TRP MEASUREMENT | 26.0 | 26.9 | 27.3 |
| EQUIVALENT TRP MEASUREMENT (dBm) | 26.5 | 26.9 | 26.3 |
| | LOW | MID | HIGH |

| | 1900MHZ | | |
|---|---|---|---|
| FREQUENCY (MHZ) | 1850.2 | 1880 | 1909.8 |
| PATH LOSS (1m CABLE +30dB ATTENUATOR) | 30.8db | 30.8db | 30.8db |
| MAGNITUDE | 0.235 | 0.27 | 0.228 |
| PHASE (DEG) | -109 | -129 | -144 |
| TRP MEASUREMENT | 29.3 | 29.1 | 29.1 |
| EQUIVALENT TRP MEASUREMENT (dBm) | 29.6 | 29.1 | 29.2 |
| | LOW | MID | HIGH |

*FIG. 5*

SYSTEM AND METHOD OF MEASURING TOTAL RADIATED POWER FROM MOBILE WIRELESS COMMUNICATIONS DEVICE

FIELD OF THE INVENTION

The present invention relates to the field of communications devices, and more particularly, to systems and methods that measure total radiated power (TRP) from communications devices.

BACKGROUND OF THE INVENTION

Cellular communication systems continue to grow in popularity and have become an integral part of both personal and business communications. Cellular telephones allow users to place and receive phone calls most anywhere they travel. Moreover, as cellular telephone technology is increased, so too has the functionality of cellular devices. For example, many cellular devices now incorporate Personal Digital Assistant (PDA) features such as calendars, address books, task lists, calculators, memo and writing programs, etc. These multi-function devices usually allow users to wirelessly send and receive electronic mail (email) messages and access the internet via a cellular network and/or a wireless local area network (WLAN), for example.

As the functionality of cellular communications devices continues to increase, so too does demand for smaller devices that are easier and more convenient for users to carry. As any circuit boards and electronic components thereon are reduced in size and placed closer together, including antenna and microphone components, and associated software requirements change, development costs increase. As a result, any testing of minor circuit, antenna and software changes becomes increasingly important since these minor changes can affect overall device performance, for example, the total radiated power (TRP) emitted from the device.

During the development stage of such mobile wireless communications devices, changes are made in circuit design, manufacturing specifications, antenna design, software and other modifications, affecting the TRP emitted from the device. Thus, with each modification, the device is tested to determine how the modifications affect the TRP. The measurement time for TRP in such devices typically takes about two hours across four frequency bands, for example, the 850, 900, 1800 and 1900 MHz bands. Testing also occurs in three channels for each frequency band corresponding to the low, middle and high channels. These measurements slow down the design and development of the device since testing occurs to meet system specifications such as the TRP, harmonics and similar details. Typically, TRP measurements occur in a large anechoic chamber using expensive test equipment such as a spectrum analyzer. The device to be tested is moved from the development laboratory to the anechoic chamber, which in itself takes time. The device is supported by a turntable or similar support and rotated 360 degrees horizontally and vertically to measure the total radiated power in an isotropic pattern. This is also time consuming and labor intensive, taking another two hours minimum.

With each change in device design during the development stage, multiple measurements are taken in this expensive anechoic chamber, not only tying up an expensive anechoic chamber every time a measurement is taken, but also requiring the device to be moved to the anechoic chamber from a development lab. As a result, the entire development of the device is slowed down appreciably. A better development system for measuring TRP of mobile wireless communications devices is required without making multiple measurements in an expensive anechoic chamber as is accomplished currently using prior art systems.

BRIEF DESCRIPTION OF THE DRAWINGS

Other objects, features and advantages will become apparent from the detailed description which follows when considered in light of the accompanying drawings in which:

FIG. 5 is a table showing experimental test results as a comparison and obtained using the system and method in accordance with a non-limiting example of the present invention.

DETAILED DESCRIPTION OF THE PREFERRED EMBODIMENTS

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art. Like numbers refer to like elements throughout.

A system for testing a communications device includes a portable wireless communications device comprising a transmitter for transmitting an RF signal. A monitoring device receives the REF signals from the portable wireless communications device and analyzes the RF signals to determine total radiated power emitted from the transmitter. An adaptive antenna equivalent circuit is coupled to the transmitter. A connection line extends between the adaptive antenna equivalent circuit and the monitoring device. The adaptive antenna equivalent circuit has an equivalent antenna impedance matched to the portable wireless communications device and the connection line and monitoring device based on transmit frequency to ensure that total radiated power of the RF signals is transmitted from the transmitter to the monitoring device.

A controller is operatively connected to the adaptive antenna equivalent circuit for varying the impedance to adapt to impedance changes resulting form a change in frequency of the transmitter. The adaptive antenna equivalent circuit is formed as grounded parallel capacitors. In yet another aspect, a conductor of predetermined wavelength is matched for the portable wireless communications device and extends between the grounded capacitors. The antenna equivalent circuit can be formed by at least one variable capacitor.

In another aspect, the monitoring device is formed as a spectrum analyzer. The connection line coupling the adaptive antenna equivalent circuit and monitoring device is formed as a coaxial cable such as a 50 ohm antenna cable. The portable wireless communications device can include a power amplifier and power amplifier matching network coupled to the adaptive antenna equivalent circuit. A grounded switch can be coupled between the power amplifier matching network and adaptive antenna equivalent circuit.

A method aspect is also set forth.

Figure 1:
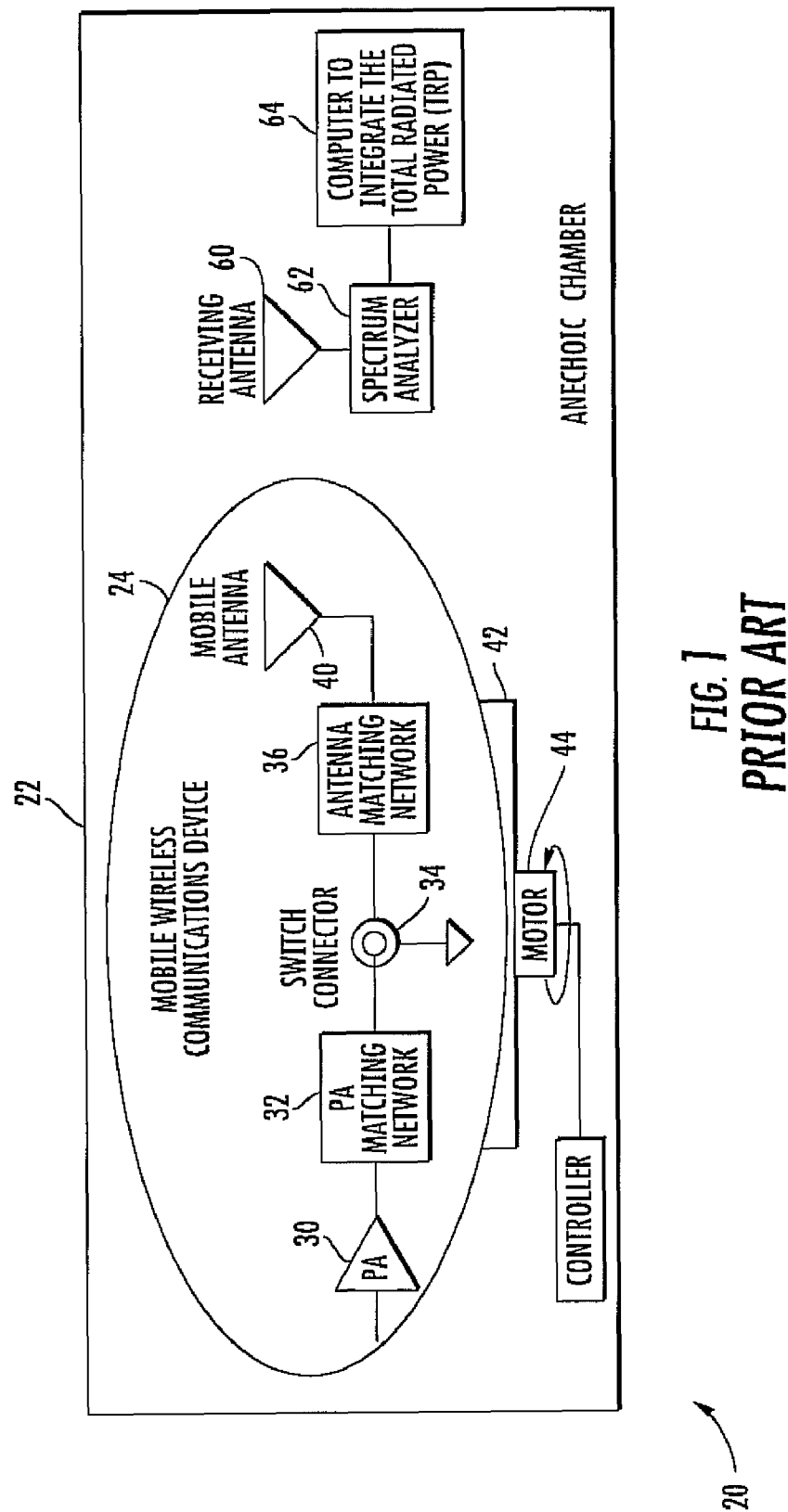
FIG. 1 is a fragmentary, block diagram of a prior art system for measuring total radiated power (TRP) of a mobile wireless communications device that uses an anechoic chamber.

FIG. 1 is a fragmentary block diagram showing a prior art system 20 for measuring total radiated power using an anechoic chamber illustrated at 22. A mobile wireless communications device is illustrated diagrammatically at 24 and includes basic modules and components of a communications device necessary for transmitting and receiving communications signals. The device 24 operates as a device-under-test (DUT) in this prior art system 20, and includes a power amplifier 30, a power amplifier matching network 32, switch connector 34, antenna matching network 36 and mobile antenna 38.

The power amplifier 30 receives signals to be transmitted from transmitter circuitry located within the device 24 and outputs RF signals to the power amplifier matching network 32, which matches the network and impedance through the switch connector 34 to the antenna matching network 36. Thus, the proper impedance is maintained between the power amplifier 30, power amplifier matching network 32 and antenna matching network 36 such that RF signals are transmitted through the mobile antenna 40 at the radiated power in which the device is designed without impedance mismatch.

The mobile wireless communications device 24 is typically mounted on a turntable 42 or similar rotating device, allowing the communications device 24 to turn 360 degrees horizontally and vertically in order to measure the total radiated power in an isotropic pattern. The turntable 42 and its associated motor 44 support the mobile wireless communications device 24 for the necessary movement. A controller 50 is operatively connected to the turntable motor 44 to control any 360 degree horizontal and vertical movement in a controlled manner. Depending on the particular device-under-test, the pattern of movement can be controlled based on signals received from any measuring equipment or from a preprogrammed pattern of movement. For example, device movement and rotation could be in a substantially spherical manner or be modified depending on testing requirements. RF signals transmitted from the mobile wireless communications device 24 are received in a receiving antenna 60 of a spectrum analyzer 62, which is connected to a computer 64 that receives the measurements from the spectrum analyzer and integrates the measurements to calculate a total radiated power (TRP).

Such prior art systems as described require the use of the anechoic chamber 22 and the transport of the mobile wireless communications device 20 from a development laboratory or other design area to the anechoic chamber 22. The testing in the anechoic chamber 22 takes about two hours across four frequency bands, in one example, such as 850, 900, 1800 and 1900 MHz. Each band typically requires three measurements for low, middle and high channels of a particular frequency band. Once the TRP measurement occurs, the device is transported back to the development lab, taking even more time. If the total radiated power with the design change is less than it was before the design change, or below any required design specifications or requirements, the device change or circuit modification is inadequate and a new circuit design is implemented, requiring another series of time-consuming transport and testing within the anechoic chamber.

Figure 2:
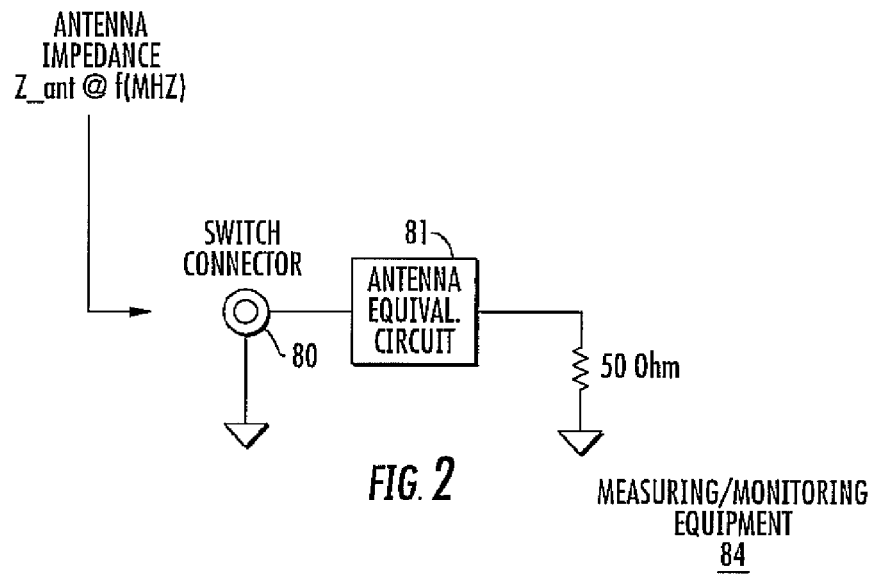
FIG. 2 is a block circuit diagram showing a single antenna equivalent circuit used with TRP monitoring devices for a mobile wireless communications device without an anechoic chamber in accordance with a non-limiting example of the present invention.
Figure 3:
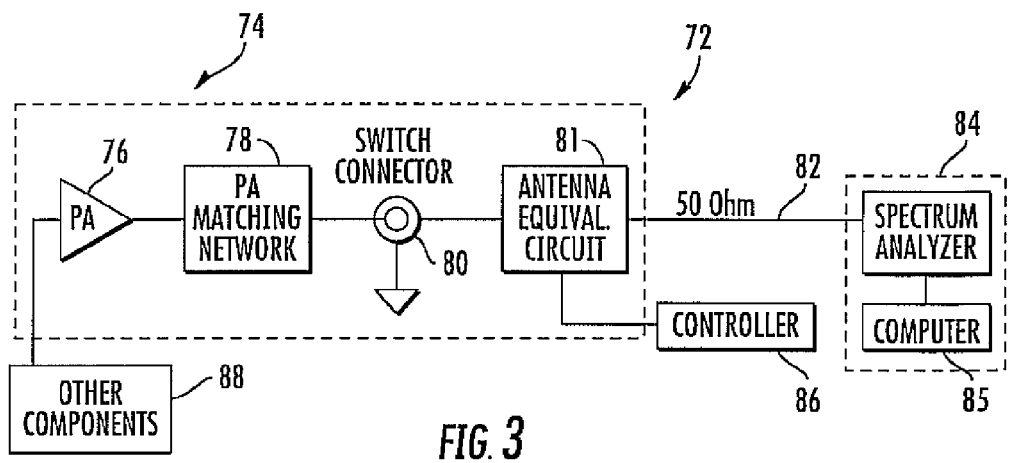
FIG. 3 is a block diagram showing a system and method for measuring TRP in accordance with a non-limiting example of the present invention.
Figure 4:
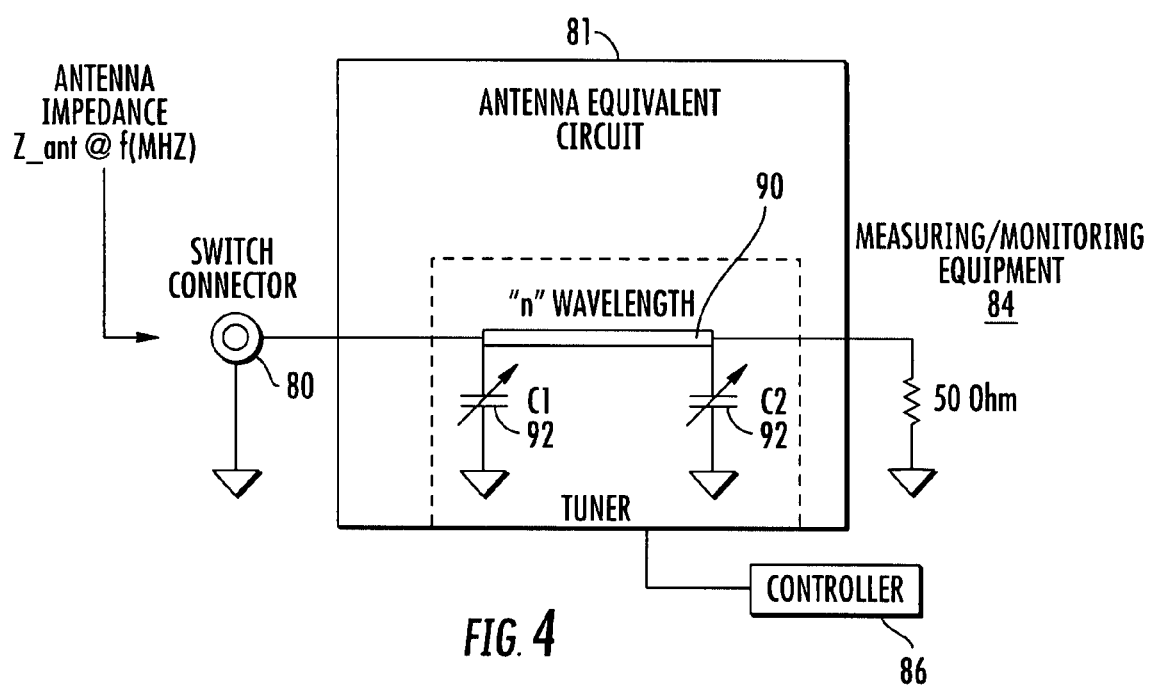
FIG. 4 is a circuit block diagram showing an example of an adaptive antenna equivalent circuit as a variable tuner for changing impedance in accordance with a non-limiting example of the present invention.

Referring now to FIGS. 2-4, a system and method in accordance with a non-limiting example of the present invention is now set forth such that testing and estimating the total radiated power of a portable wireless communications device can occur within a development laboratory without having to transport the device to another facility for expensive and time-consuming testing within an anechoic chamber. The mobile wireless communications device includes an antenna equivalent circuit that is equivalent to the antenna matching network as shown in the prior art of FIG. 1. As shown in FIG. 2, the switch connector is connected to the antenna equivalent circuit and a 50 ohm circuit corresponding to the impedance of the measuring equipment such as a spectrum analyzer.

The system 72 in accordance with a non-limiting example as shown in FIG. 3, includes a mobile wireless communications device 74 as a device-under-test in which its power amplifier 76 connects to its power amplifier matching network 78 and its switch connector 80. These components are similar to the components in FIG. 1. The antenna equivalent circuit 81 is connected by a connection line 82 to the monitoring device, in this non-limiting example, a spectrum analyzer 84. A separate computer 85 for calculating TRP can be connected to the spectrum analyzer, or the spectrum analyzer and computer could be integrated as one unit as shown by the dashed lines. The connection line corresponds to a cable having the impedance of the monitoring device as measuring equipment, in this case the spectrum analyzer 84. The connection line 82, in one non-limiting example, is a standard 50 ohm coaxial antenna cable used by many skilled in the art. The standard impedance based on monitoring devices is about 50 ohms, but of course, other lines as cables having different impedances could be used as long as impedance adjustments are made. The antenna equivalent circuit 81 and the overall system 72 are designed under the assumption that the normal TRP measurement is lossless and the RF path loss can be calibrated out.

The simplified antenna equivalent circuit 81 can be used with a communications test set for a spectrum analyzer 84, such as a Universal Radio Communication Tester CMU200, as manufactured by Rohde and Schwarz. To achieve accurate TRP measurement through the antenna equivalent circuit 81, the input impedance of this circuit, for example, with a 50 ohm loading from the spectrum analyzer 84 to its output port, is designed to reflect the same impedance at a specified frequency point as that of an antenna of the portable wireless communications device. Thus, the antenna equivalent circuit operates similar to a lossless two-port network, for example, designed using an RF circuit design tool based on measured antenna input impedance. The antenna equivalent circuit 81 can vary in its impedance to match different frequencies, for example, controlled through a controller 86, which could include feedback from the device 74 or spectrum analyzer 84 or control the impedance based on programmed changes in transmit frequencies from the device 74. As a result, the antenna equivalent circuit 81 can vary in its impedance and look to the device 74 as if it is an antenna impedance at a selected single frequency point. The section of the device shown by dashed lines in FIG. 3 could be a separate module and connected to other components 88 and a mobile wireless communications device as a device-under-test as a non-limiting example.

FIG. 4 is an example of the antenna equivalent circuit 81 designed in a tuner configuration such that the impedance can be changed to adapt to any frequency for testing. For this reason, the circuit can be termed an adaptive antenna equivalent circuit. This circuit includes a circuit line 90 of predetermined "n" wavelength and two parallel, variable capacitors 92 in a pie configuration and controlled by the controller 86 to operate as a tuner for varying capacitance and thus impedance. In this example, a ⅛ wavelength circuit line could be used, but other lengths based on different wavelengths could be used depending on the device-under-test, the transmit frequencies and other variables. In this example, capacitance can be varied to control the impedance, which changes with transmit frequency. As the frequency changes up and down, the impedance changes, and thus, the adaptive antenna equivalent circuit 81 as a tuner can vary to ensure any proper impedance match with the measuring equipment as a spectrum analyzer in this non-limiting example. Thus, the antenna equivalent circuit 81 is variable for the different frequencies emitted by the mobile wireless communications device. The controller 86 operates to change the capacitance of the tuner through the variable capacitors and controls the proper impedance as the mobile wireless communications device transmits or emits its RF energy and changes frequency during a test phase.

The Universal Radio Communication Tester in this example as the CMU200 is only one non-limiting example of the type of measuring equipment as a monitoring device, for example, spectrum analyzer, which can be used, in accordance with a non-limiting example of the present invention. The equipment is a multi-protocol tester for current and future mobile radio networks that incorporates digital signal processor (DSP) technology, parallel measurements and remote command processing. It has a modular architecture that works similar to an oscilloscope probe with the DSP dedicated to specific local data acquisition and evaluation workload. Measurements can be made in a signaling and non-signaling mode and operated in remote or manual configuration. A graphical user interface simplifies operation. The system has a software platform and can incorporate a test stand as a fixture for holding a portable wireless communications device. It is possible to perform parallel testing of multiple mobile wireless communications devices. Further details are set forth in the CMU200 specification sheet that is incorporated herein by reference in its entirety.

In accordance with a non-limiting example of the present invention, total radiated power measurements can now be accomplished in 20 minutes using the system 72 as described, as compared to multiple hours of testing in an anechoic chamber. The mobile wireless communications device does not have to be transported from a development lab to an anechoic chamber as in the prior art system shown in FIG. 1. The control over the antenna equivalent circuit as a tuner, as shown in FIG. 4, permits the system to vary impedance frequency changes during testing of the mobile wireless communications device.

FIG. 5 is a table showing a comparison made between normal TRP measurements and an equivalent circuit measurement in accordance with a non-limiting example of the present invention. Measurements are shown for 850, 900, 1800 and 1900 MHz. Frequencies are shown in the respective low, middle and high channels as illustrated. Path loss for a one-meter cable with 30 decibel attenuator is shown. The magnitude phase in degrees and the equivalent TRP measurement is illustrated. The TRP measurement for each of the four frequency bands with the three channels is shown.

Figure 6:
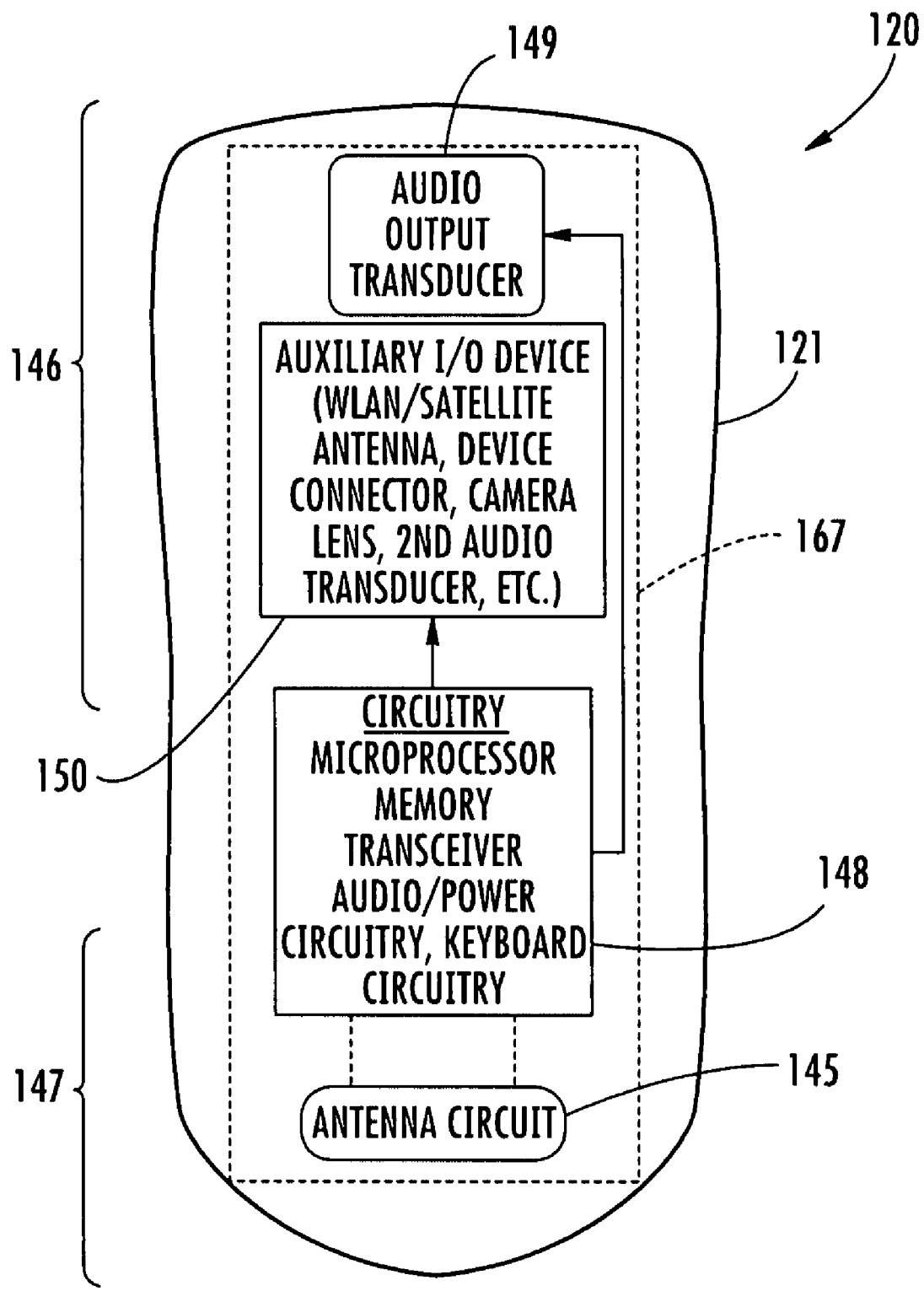
FIG. 6 is a schematic block diagram of an example of a mobile wireless communications device configured as a handheld device that can be used as a device-under-test (DUT) for the system shown in FIG. 3 and illustrating basic internal components thereof.
Figure 7:
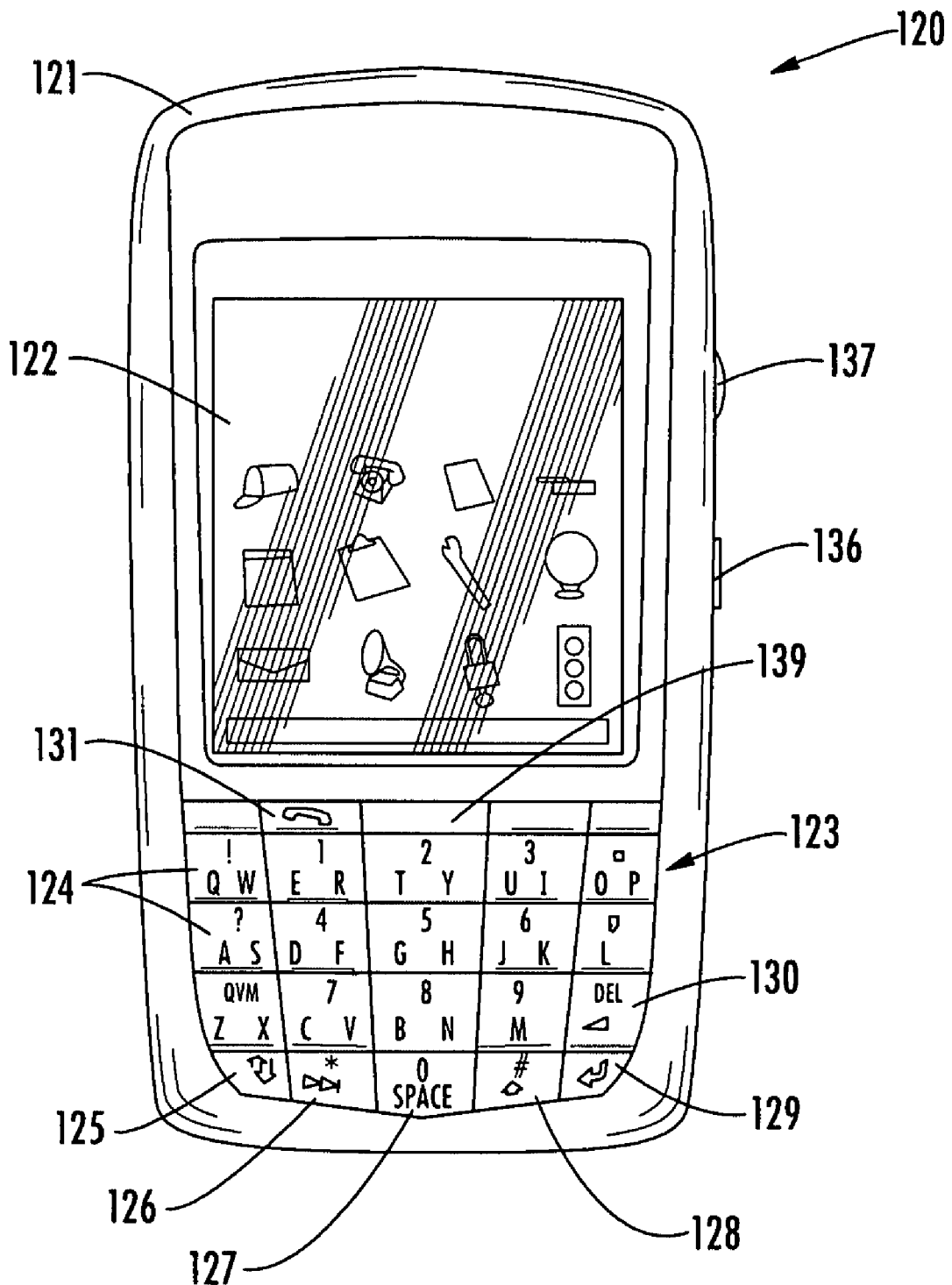
FIG. 7 is a front elevation view of the mobile wireless communications device of FIG. 6.
Figure 8:
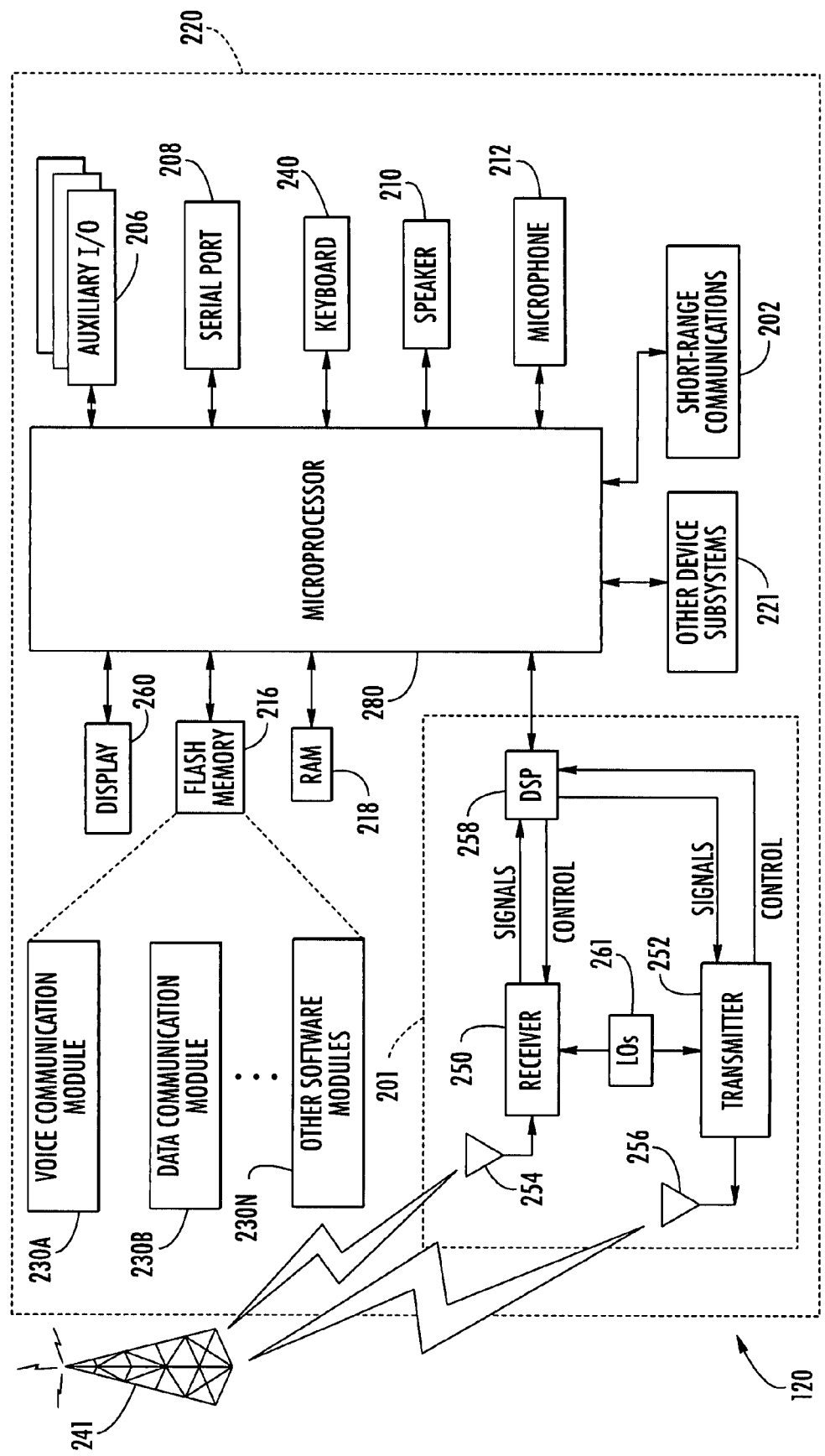
FIG. 8 is a schematic block diagram showing basic functional circuit components that can be used in the mobile wireless communications device of FIGS. 6-7.

A brief description will now proceed relative to FIGS. 6-8, which disclose an example of a mobile wireless communications device, for example, a handheld portable cellular radio, which can incorporate the non-limiting examples of the various circuits. FIGS. 6-8 are representative non-limiting examples of the many different types of functional circuit components and their interconnection.

Referring initially to FIGS. 6 and 7, an example of a mobile wireless communications device 120, such as a handheld portable cellular radio is first described. This device 120 illustratively includes a housing 121 having an upper portion 146 and a lower portion 147, and a dielectric substrate (i.e., circuit board) 167, such as a conventional printed circuit board (PCB) substrate, for example, carried by the housing. A housing cover (not shown in detail) would typically cover the front portion of the housing. The term circuit board 167 as used hereinafter can refer to any dielectric substrate, PCB, ceramic substrate or other circuit carrying structure for carrying signal circuits and electronic components within the mobile wireless communications device 120. The illustrated housing 121 is a static housing, for example, as opposed to a flip or sliding housing which are used in many cellular telephones. However, these and other housing configurations may also be used.

Circuitry 148 is carried by the circuit board 167, such as a microprocessor, memory, one or more wireless transceivers (e.g., cellular, WLAN, etc.), which includes RF circuitry, including audio and power circuitry, including any keyboard circuitry. It should be understood that keyboard circuitry could be on a separate keyboard, etc., as will be appreciated by those skilled in the art. A battery (not shown) is also preferably carried by the housing 121 for supplying power to the circuitry 148. The term RF circuitry could encompass the interoperable RE transceiver circuitry, power circuitry and audio circuitry.

Furthermore, an audio output transducer 149 (e.g., a speaker) is carried by an upper portion 146 of the housing 121 and connected to the circuitry 148. One or more user input interface devices, such as a keypad (keyboard) 123 (FIG. 7), is also preferably carried by the housing 121 and connected to the circuitry 148. The term keypad as used herein also refers to the term keyboard, indicating the user input devices having lettered and/or numbered keys commonly known and other embodiments, including multi-top or predictive entry modes. Other examples of user input interface devices include a scroll wheel 137 and a back button 136. Of course, it will be appreciated that other user input interface devices (e.g., a stylus or touch screen interface) may be used in other embodiments.

An antenna 145 is preferably positioned at the lower portion 147 in the housing and can be formed as a pattern of conductive traces that make an antenna circuit, which physically forms the antenna. It is connected to the circuitry 148 on the main circuit board 167. In one non-limiting example, the antenna could be formed on an antenna circuit board section that extends from the circuit board at the lower portion of the housing. By placing the antenna 145 adjacent the lower portion 147 of the housing 121, the distance is advantageously increased between the antenna and the user's head when the phone is in use to aid in complying with applicable SAR requirements. Also, a separate keyboard circuit board could be used.

More particularly, a user will typically hold the upper portion of the housing 121 very close to his head so that the audio output transducer 149 is directly next to his ear. Yet, the lower portion 147 of the housing 121 where an audio input transducer (i.e., microphone) is located need not be placed directly next to a user's mouth, and can be held away from the user's mouth. That is, holding the audio input transducer close to the user's mouth may not only be uncomfortable for the user, but it may also distort the user's voice in some circumstances. In addition, the placement of the antenna 145 adjacent the lower portion 147 of the housing 121 also advantageously spaces the antenna farther away from the user's brain.

Another important benefit of placing the antenna 145 adjacent the lower portion 147 of the housing 121 is that this may allow for less impact on antenna performance due to blockage by a user's hand. That is, users typically hold cellular phones toward the middle to upper portion of the phone housing, and are therefore more likely to put their hands over such an antenna than they are an antenna mounted adjacent the lower portion 147 of the housing 121. Accordingly, more reliable performance may be achieved from placing the antenna 145 adjacent the lower portion 147 of the housing 121.

Still another benefit of this configuration is that it provides more room for one or more auxiliary input/output (I/O) devices 150 to be carried at the upper portion 146 of the housing. Furthermore, by separating the antenna 145 from the auxiliary I/O device(s) 150, this may allow for reduced interference therebetween.

Some examples of auxiliary I/O devices 150 include a WLAN (e.g., Bluetooth, IEEE 802.11) antenna for providing WLAN communication capabilities, and/or a satellite positioning system (e.g., GPS, Galileo, etc.) antenna for providing position location capabilities, as will be appreciated by those skilled in the art. Other examples of auxiliary I/O devices 150 include a second audio output transducer (e.g., a speaker for speaker phone operation), and a camera lens for providing digital camera capabilities, an electrical device connector (e.g., USB, headphone, secure digital (SD) or memory card, etc.).

It should be noted that the term "input/output" as used herein for the auxiliary I/O device(s) 150 means that such devices may have input and/or output capabilities, and they need not provide both in all embodiments. That is, devices such as camera lenses may only receive an optical input, for example, while a headphone jack may only provide an audio output.

The device 120 further illustratively includes a display 122, for example, a liquid crystal display (LCD) carried by the housing 121 and connected to the circuitry 148. A back button 136 and scroll wheel 137 can also be connected to the circuitry 148 for allowing a user to navigate menus, text, etc., as will be appreciated by those skilled in the art. The scroll wheel 137 may also be referred to as a "thumb wheel" or a "track wheel" in some instances. The keypad 123 illustratively includes a plurality of multi-symbol keys 124 each having indicia of a plurality of respective symbols thereon. The keypad 123 also illustratively includes an alternate function key 125, a next key 126, a space key 127, a shift key 128, a return (or enter) key 129, and a backspace/delete key 130.

The next key 126 is also used to enter a "*" symbol upon first pressing or actuating the alternate function key 125. Similarly, the space key 127, shift key 128 and backspace key 130 are used to enter a "0" and "#", respectively, upon first actuating the alternate function key 125. The keypad 123 further illustratively includes a send key 131, an end key 132, and a convenience (i.e., menu) key 139 for use in placing cellular telephone calls, as will be appreciated by those skilled in the art.

Moreover, the symbols on each key 124 are arranged in top and bottom rows. The symbols in the bottom rows are entered when a user presses a key 124 without first pressing the alternate function key 25, while the top row symbols are entered by first pressing the alternate function key. As seen in FIG. 7, the multi-symbol keys 124 are arranged in the first three rows on the keypad 123 below the send and end keys 131, 132. Furthermore, the letter symbols on each of the keys 124 are arranged to define a QWERTY layout. That is, the letters on the keypad 123 are presented in a three-row format, with the letters of each row being in the same order and relative position as in a standard QWERTY keypad.

Each row of keys (including the fourth row of function keys 125-129) is arranged in five columns. The multi-symbol keys 124 in the second, third, and fourth columns of the first, second, and third rows have numeric indicia thereon (i.e., 1 through 9) accessible by first actuating the alternate function key 125. Coupled with the next, space, and shift keys 126, 127, 128, which respectively enter a "*", "0", and "#" upon first actuating the alternate function key 125, as noted above, this set of keys defines a standard telephone keypad layout, as would be found on a traditional touch-tone telephone, as will be appreciated by those skilled in the art.

Accordingly, the mobile wireless communications device 120 as described may advantageously be used not only as a traditional cellular phone, but it may also be conveniently used for sending and/or receiving data over a cellular or other network, such as Internet and email data, for example. Of course, other keypad configurations may also be used in other embodiments. Multi-tap or predictive entry modes may be used for typing e-mails, etc. as will be appreciated by those skilled in the art.

The antenna 145 is preferably formed as a multi-frequency band antenna, which provides enhanced transmission and reception characteristics over multiple operating frequencies. More particularly, the antenna 145 is designed to provide high gain, desired impedance matching, and meet applicable SAR requirements over a relatively wide bandwidth and multiple cellular frequency bands. By way of example, the antenna 145 preferably operates over five bands, namely a 850 MHz Global System for Mobile Communications (GSM) band, a 900 MHz GSM band, a DCS band, a PCS band, and a WCDMA band (i.e., up to about 2100 MHz), although it may be used for other bands/frequencies as well. To conserve space, the antenna 145 may advantageously be implemented in three dimensions although it may be implemented in two-dimensional or planar embodiments as well.

The mobile wireless communications device shown in FIGS. 6 and 7 can incorporate e-mail and messaging accounts and provide different functions such as composing e-mail, PIN messages, and SMS messages. The device can manage messages through an appropriate menu that can be retrieved by choosing a messages icon. An address book function could add contacts, allow management of an address book, set address book options and manage SIM card phone books. A phone menu could allow for the making and answering of phone calls using different phone features, managing phone call logs, setting phone options, and viewing phone information. A browser application could permit the browsing of web pages, configuring a browser, adding bookmarks, and changing browser options. Other applications could include a task, memo pad, calculator, alarm and games, as well as handheld options with various references.

A calendar icon can be chosen for entering a calendar program that can be used for establishing and managing events such as meetings or appointments. The calendar program could be any type of messaging or appointment/meeting program that allows an organizer to establish an event, for example, an appointment or meeting.

A non-limiting example of various functional components that can be used in the exemplary mobile wireless communications device 120 of FIGS. 6 and 7 is further described in the example below with reference to FIG. 8. The device 120 illustratively includes a housing 220, a keypad 240 and an output device 260. The output device 260 shown is preferably a display, which is preferably a full graphic LCD. Other types of output devices may alternatively be used. A processing device 280 is contained within the housing 220 and is coupled between the keypad 240 and the display 260. The processing device 280 controls the operation of the display 260, as well as the overall operation of the mobile device 120, in response to actuation of keys on the keypad 240 by the user.

The housing 220 may be elongated vertically, or may take on other sizes and shapes (including clamshell housing structures). The keypad may include a mode selection key, or other hardware or software for switching between text entry and telephony entry.

In addition to the processing device 280, other parts of the mobile device 120 are shown schematically in FIG. 8. These include a communications subsystem 201; a short-range communications subsystem 202; the keypad 240 and the display 260, along with other input/output devices 206, 208, 210 and 212; as well as memory devices 216, 218 and various other device subsystems 221. The mobile device 120 is preferably a two-way RF communications device having voice and data communications capabilities. In addition, the mobile device 120 preferably has the capability to communicate with other computer systems via the Internet.

Operating system software executed by the processing device 280 is preferably stored in a persistent store, such as the flash memory 216, but may be stored in other types of memory devices, such as a read only memory (ROM) or similar storage element. In addition, system software, specific device applications, or parts thereof, may be temporarily loaded into a volatile store, such as the random access memory (RAM) 218. Communications signals received by the mobile device may also be stored in the RAM 218.

The processing device 280, in addition to its operating system functions, enables execution of software applications 230A-230N on the device 120. A predetermined set of applications that control basic device operations, such as data and voice communications 230A and 230B, may be installed on the device 120 during manufacture. In addition, a personal information manager (PIM) application may be installed during manufacture. The PIM is preferably capable of organizing and managing data items, such as e-mail, calendar events, voice mails, appointments, and task items. The PIM application is also preferably capable of sending and receiving data items via a wireless network 241. Preferably, the PIM data items are seamlessly integrated, synchronized and updated via the wireless network 241 with the device user's corresponding data items stored or associated with a host computer system.

Communication functions, including data and voice communications, are performed through the communications subsystem 201, and possibly through the short-range communications subsystem. The communications subsystem 201 includes a receiver 250, a transmitter 252, and one or more antennae 254 and 256. In addition, the communications subsystem 201 also includes a processing module, such as a digital signal processor (DSP) 258, and local oscillators (LOs) 261. The specific design and implementation of the communications subsystem 201 is dependent upon the communications network in which the mobile device 120 is intended to operate. For example, the mobile device 120 may include a communications subsystem 101 designed to operate with the Mobitex™, Data TAC™ or General Packet Radio Service (GPRS) mobile data communications networks, and also designed to operate with any of a variety of voice communications networks, such as AMPS, TDMA, CDMA, PCS, GSM, etc. Other types of data and voice networks, both separate and integrated, may also be utilized with the mobile device 120.

Network access requirements vary depending upon the type of communication system. For example, in the Mobitex and DataTAC networks, mobile devices are registered on the network using a unique personal identification number or PIN associated with each device. In GPRS networks, however, network access is associated with a subscriber or user of a device. A GPRS device therefore requires a subscriber identity module, commonly referred to as a SIM card, in order to operate on a GPRS network.

When required network registration or activation procedures have been completed, the mobile device 120 may send and receive communications signals over the communication network 241. Signals received from the communications network 241 by the antenna 254 are routed to the receiver 250, which provides for signal amplification, frequency down conversion, filtering, channel selection, etc., and may also provide analog to digital conversion. Analog-to-digital conversion of the received signal allows the DSP 258 to perform more complex communications functions, such as demodulation and decoding. In a similar manner, signals to be transmitted to the network 241 are processed (e.g., modulated and encoded) by the DSP 258 and are then provided to the transmitter 252 for digital to analog conversion, frequency up conversion, filtering, amplification and transmission to the communication network 241 (or networks) via the antenna 256.

In addition to processing communications signals, the DSP 258 provides for control of the receiver 250 and the transmitter 252. For example, gains applied to communications signals in the receiver 250 and transmitter 252 may be adaptively controlled through automatic gain control algorithms implemented in the DSP 258.

In a data communications mode, a received signal, such as a text message or web page download, is processed by the communications subsystem 201 and is input to the processing device 280. The received signal is then further processed by the processing device 280 for an output to the display 260, or alternatively to some other auxiliary I/O device 206. A device user may also compose data items, such as e-mail messages, using the keypad 240 and/or some other auxiliary I/O device 206, such as a touchpad, a rocker switch, a thumb-wheel, or some other type of input device. The composed data items may then be transmitted over the communications network 241 via the communications subsystem 201.

In a voice communications mode, overall operation of the device is substantially similar to the data communications mode, except that received signals are output to a speaker 210, and signals for transmission are generated by a microphone 212. Alternative voice or audio I/O subsystems, such as a voice message recording subsystem, may also be implemented on the device 120. In addition, the display 260 may also be utilized in voice communications mode, for example to display the identity of a calling party, the duration of a voice call, or other voice call related information.

Any short-range communications subsystem enables communication between the mobile device 120 and other proximate systems or devices, which need not necessarily be similar devices. For example, the short-range communications subsystem may include an infrared device and associated circuits and components, or a Bluetooth™ communications module to provide for communication with similarly-enabled systems and devices.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A system for testing a communications device comprising:
    a portable wireless communications device comprising a transmitter transmits an RF signal and comprising a power amplifier and power amplifier matching network connected thereto;
    a monitoring device receives RF signals from the portable wireless communications device and analyzing the RF signals to determine total radiated power emitted from the transmitter; and
    an adaptive antenna equivalent circuit coupled to the power amplifier matching network, and a connection line extending between the adaptive antenna equivalent circuit and the monitoring device, and further comprising a controller operatively connected to said adaptive antenna equivalent circuit and configured to vary the impedance and adapt to impedance changes resulting from a change in frequency of the transmitter and adapt to different frequencies for testing, wherein said adaptive antenna equivalent circuit has an equivalent antenna impedance matched to the portable wireless communications device and the connection line and monitoring device based on transmit frequency to ensure that total radiated power of the RF signals is transmitted from the transmitter to the monitoring device.

2. A system according to claim 1, wherein said adaptive antenna equivalent circuit comprises grounded, parallel capacitors.

3. A system according to claim 2, and further comprising a conductor of predetermined wavelength that is matched for the portable wireless communications device and extending between said grounded capacitors.

4. A system according to claim 1, wherein said adaptive antenna equivalent circuit comprises at least one variable capacitor.

5. A system according to claim 1, wherein monitoring device comprises a spectrum analyzer.

6. A system according to claim 1, wherein said connection line coupling the adaptive antenna equivalent circuit and monitoring device comprises a coaxial cable.

7. A system according to claim 6, wherein said coaxial cable comprises 50 ohm antenna cable.

8. A system according to claim 1, and further comprising a grounded switch coupled between said power amplifier matching network and adaptive antenna equivalent circuit.

9. A system for testing a communications device comprising:
    a portable wireless communications device comprising a transmitter transmits RF signals over a plurality of frequency bands corresponding to at lest the 850, 900, 1800 and 1900 MHz frequency bands and in a plurality of channels within each frequency band and comprising a power amplifier and power amplifier matching network connected thereto;
    a monitoring device receives RF signals from the portable wireless communications device and analyzing the RF signals to determine total radiated power emitted from the transmitter; and
    an adaptive antenna equivalent circuit coupled to the power amplifier matching network, and a connection line extending between the adaptive antenna equivalent circuit and the monitoring device, and further comprising a controller operatively connected to said adaptive antenna equivalent circuit and configured to vary the impedance and adapt to impedance changes resulting from a change in frequency of the transmitter and adapt to different frequencies for testing, wherein said adaptive antenna equivalent circuit comprises a variable capacitor circuit having a capacitance that is varied to match an equivalent antenna impedance to a portable wireless communications device and the connection line and monitoring device based on the frequency band and channel on which an RF signal is transmitted to ensure that total radiated power of the RF signals is transmitted from the transmitter to the monitoring device.

10. A system according to claim 9, wherein said adaptive antenna equivalent circuit comprises grounded, and parallel variable capacitors.

11. A system according to claim 9, and further comprising a conductor of predetermined wavelength that is matched to the portable wireless communications device and extending between said grounded and parallel variable capacitors.

12. A system according to claim 9, wherein monitoring device comprises a spectrum analyzer.

13. A system according to claim 9, wherein said connection line coupling the adaptive antenna equivalent circuit and monitoring device comprises a coaxial cable.

14. A system according to claim 13, wherein said coaxial cable comprises a 50 ohm antenna cable.

15. A system according to claim 9, and further comprising a grounded switch coupled between said power amplifier matching network and adaptive antenna equivalent circuit.

16. A method for testing a communications device, comprising:
    coupling a portable wireless communications device that comprises a power amplifier and power amplifier matching network to a monitoring device through an adaptive antenna equivalent circuit and a connection line extending between the adaptive antenna equivalent circuit and the monitoring device, wherein the adaptive antenna equivalent circuit has an equivalent antenna impedance matched to the portable wireless communications device and the connection line and monitoring device based on a transmit frequency;

transmitting an RF signal from the portable wireless communications device through the adaptive antenna equivalent circuit and the connection line to the monitoring device;
determining total radiated power based on measurements of the RF signal at the monitoring device; and
further comprising varying the impedance of the adaptive antenna equivalent circuit to adapt to impedance changes resulting from a change in frequency of the portable wireless communications device using a controller that is operatively connected to the adaptive antenna equivalent circuit and configured to vary the impedance and adapt to impedance changes resulting from a change in frequency of the transmitter and adapt to different frequencies for testing.

17. The method according to claim 16, which further comprises transmitting RF signals through a coaxial cable connected between the adaptive antenna equivalent circuit and the monitoring device.

18. The method according to claim 16, which further comprises amplifying RF signals within a power amplifier and transmitting through a power amplifier matching network to the adaptive antenna equivalent circuit.

\* \* \* \* \*

UNITED STATES PATENT AND TRADEMARK OFFICE
CERTIFICATE OF CORRECTION

PATENT NO. : 8,244,234 B2  
APPLICATION NO. : 11/831983  
DATED : August 14, 2012  
INVENTOR(S) : Zhu et al.

Page 1 of 1

It is certified that error appears in the above-identified patent and that said Letters Patent is hereby corrected as shown below:

Column 11, Line 56    Delete: "grounded capacitors"  
                      Insert: --grounded parallel capacitors--

Column 13, Line 7     Delete: "further comprising varying"  
                      Insert: --varying--

Signed and Sealed this  
Fourth Day of December, 2012

David J. Kappos  
*Director of the United States Patent and Trademark Office*